US011029276B2

(12) United States Patent
Banach et al.

(10) Patent No.: US 11,029,276 B2
(45) Date of Patent: Jun. 8, 2021

(54) SENSING DEVICE (71) Applicant: FLEXENABLE LIMITED, Cambridge (GB)

(72) Inventors: Micheal James Banach, Cambridge (GB); Guillaume Fichet, Cambridge (GB)

(73) Assignee: FLEXENBLE LIMITED, Cambridge (GB)

( * ) Notice: Subject to any disclaimer, the term of this patent is extended or adjusted under 35 U.S.C. 154(b) by 385 days.

(21) Appl. No.: 15/766,438

(22) PCT Filed: Oct. 6, 2016

(86) PCT No.: PCT/EP2016/073922
§ 371 (c)(1),
(2) Date: Apr. 6, 2018

(87) PCT Pub. No.: WO2017/060380
PCT Pub. Date: Apr. 13, 2017

(65) Prior Publication Data
US 2018/0313778 A1    Nov. 1, 2018

(30) Foreign Application Priority Data

Oct. 9, 2015 (GB) .................................. 1517922
Oct. 9, 2015 (GB) .................................. 1517923
Mar. 3, 2016 (GB) .................................. 1603717

(51) Int. Cl.
*G01N 27/30* (2006.01)
*B32B 33/00* (2006.01)
(Continued)

(52) U.S. Cl.
CPC .............. *G01N 27/307* (2013.01); *B32B 3/00* (2013.01); *B32B 3/18* (2013.01); *B32B 33/00* (2013.01);
(Continued)

(58) Field of Classification Search
CPC .. G01N 27/307; G01N 27/4045; G01N 27/28; G01N 27/30; G01N 27/3272;
(Continued)

(56) References Cited

U.S. PATENT DOCUMENTS 3,787,308 A    1/1974  Malaspina et al.
2010/0206350 A1*  8/2010  Montello ............ H01L 21/6715
                                                    136/244

FOREIGN PATENT DOCUMENTS

EP    1 760 460 A1    3/2007
GB    2 505 166 A     2/2014

OTHER PUBLICATIONS

Zaban et al., "Internal Reference Electrode in Dye Sensitized Solar Cells for Three-Electrode Electrochemical Characterizations", J. Phys. Chem. B, vol. 107, No. 25, pp. 6022-6025, https://pubs.acs.org/doi/pdf/10.1021/jp034554a (May 2003). (Year: 2003).*
(Continued)

*Primary Examiner* — Michael N Orlando
*Assistant Examiner* — Christopher W Raimund
(74) *Attorney, Agent, or Firm* — Sughrue Mion, PLLC (57) ABSTRACT

A technique for producing a device for sensing a target species, comprising: providing first end second components, each comprising a support film, wherein at least one of said first and second components comprises at least one working electrode supported on the respective support film, at least one of said first and second components comprises at least one counter electrode supported on the respective support film, at least one of said first and second components defines a containing barrier supported on the respective support film, and at least one of said first and second components comprises an array of spacer structures supported on the respective support film; depositing a volume of liquid electrolyte on said first component; laminating said second component to said first component so as to spread said (Continued)

volume of liquid electrolyte out in a space created by said array of spacer structures within a liquid electrolyte area bounded by said containing barrier; wherein said liquid electrolyte functions to transport at least one electrochemical reaction product of an electrochemical reaction of the target species at the working electrode to the counter electrode for a counter electrochemical reaction at the counter electrode.

18 Claims, 4 Drawing Sheets

(51) Int. Cl.
    *B32B 37/14*     (2006.01)
    *B32B 3/18*     (2006.01)
    *B32B 3/00*     (2006.01)
    *G01N 27/404*     (2006.01)
    *G03F 7/004*     (2006.01)
    *B32B 37/12*     (2006.01)

(52) U.S. Cl.
    CPC ......... *B32B 37/14* (2013.01); *G01N 27/4045* (2013.01); *G03F 7/0047* (2013.01); *B32B 37/12* (2013.01); *B32B 37/1284* (2013.01); *B32B 2305/02* (2013.01); *B32B 2457/00* (2013.01)

(58) Field of Classification Search
    CPC ...... G01N 27/403; G01N 27/413; B32B 3/00; B32B 33/00; B32B 37/14; B32B 3/18; B32B 37/12; B32B 2457/00; B32B 37/1284; B32B 2305/02; G03F 7/0047
    See application file for complete search history.

(56) References Cited

OTHER PUBLICATIONS

Ebnesajjad, ed., Adhesives Technology Handbook, 2nd ed., Chapter 8—Adhesive Applications and Bonding Processes, 2nd ed. (2009) (Year: 2009).*
International Search Report for PCT/EP2016/073922 dated Nov. 23, 2016 [PCT/ISA/210].
Great Britain Search Report for GB 1603717.8 dated Aug. 23, 2016.

* cited by examiner

SENSING DEVICE

CROSS REFERENCE TO RELATED APPLICATIONS

This application is a National Stage of International Application No. PCT/EP2016/073922, filed on Oct. 6, 2016, which claims priority from British Patent Application Nos. 1517923.7, filed on Oct. 9, 2015, 1517922.9, filed on Oct. 9, 2015, and 1603717.8, filed on Mar. 3, 2016.

Some sensing devices operate by the electrochemical reaction of a target species at an electrode of an electrochemical cell. The electrochemical cell for sensing devices has conventionally been formed by filling a pre-prepared housing with a liquid electrolyte. Solid electrolytes have also been developed, which are easier to contain within a sensing device; but solid electrolytes are currently available for only a limited range of target species.

The inventors for the present application have identified the challenge of providing a new type of sensing device using liquid electrolytes.

There is hereby provided a method of producing a device for sensing a target species, the method comprising: providing first and second components, each comprising a support film, wherein at least one of said first and second components comprises at least one working electrode supported on the respective support film, at least one of said first and second components comprises at least one counter electrode supported on the respective support film, at least one of said first and second components defines a containing barrier supported on the respective support film, and at least one of said first and second components comprises an array of spacer structures supported on the respective support film; depositing a volume of liquid electrolyte on said first component; laminating said second component to said first component so as to spread said volume of liquid electrolyte out in a space created by said array of spacer structures within a liquid electrolyte area bounded by said containing barrier; wherein said liquid electrolyte functions to transport at least one electrochemical reaction product of an electrochemical reaction of the target species at the working electrode to the counter electrode for a counter electrochemical reaction at the counter electrode.

There is also hereby provided a device for sensing a target species, comprising: first and second components laminated together, each of the first and second components comprising a respective support film, wherein at least one of said first and second components comprises at least one working electrode supported on the respective support film, at least one of said first and second components comprises at least one counter electrode supported on the respective support film, at least one of said first and second components defines a containing barrier supported on the respective support film, and at least one of said first and second components comprises an array of spacer structures supported on the respective support film; wherein the device further comprises a volume of liquid electrolyte spread out in a space created by said array of spacer structures within a liquid electrolyte area bounded by said containing barrier; and wherein said liquid electrolyte functions to transport at east one electrochemical reaction product of an electrochemical reaction of the target species at the working electrode to the counter electrode for a counter electrochemical reaction at the counter electrode.

According to one embodiment, the containing barrier at least partly comprises one or more lines of adhesive for securing the first and second components together.

According to one embodiment, the method comprises curing the one or more adhesive lines after laminating said first and second components together.

According to one embodiment, the method comprises forming a patternable layer of spacer structure material, or precursor thereto, on the respective support film, and patterning said patternable layer in situ on the respective support film to form said array of spacer structures.

According to one embodiment, the method comprises depositing a line of said liquid electrolyte material at a proximal end of said first component, and successively laminating increasingly distal portions of said second component to said first component in a lamination direction.

According to one embodiment, the method comprises applying adhesive to at least one of the first and second components before lamination; and successively laminating increasingly distal portions of said second component to said first component in a lamination direction; wherein at least a part of said adhesive applied to said first and/or second components defines an array of pairs of line sections of adhesive, each pair of line sections converging to a respective meeting point in a direction opposite to said lamination direction.

According to one embodiment, said pairs of line sections are joined to each other at distal ends of said pairs.

According to one embodiment, said array of pairs of line sections defines at least one continuous zig-zag line extending in a direction substantially perpendicular to said lamination direction.

According to one embodiment, said array of pairs of line sections is defined by at least a most distal portion of the applied adhesive in the lamination direction.

According to one embodiment, the laminating comprises using a roller to successively force increasingly distal portions of the second component against the first component whilst maintaining the part of the second component upstream of the roller under tension, and curing said most distal portion of the applied adhesive before releasing the force of the roller against the second component.

According to one embodiment, the laminating comprises using a roller to successively force increasingly distal portions of the second component against the first component whilst maintaining the part of the second component upstream of the roller under tension, and releasing the force of the roller against the second component when the roller is in contact with a finish portion of the second component, and wherein said array of pairs of line sections is defined by the applied adhesive in at least said finish portion and/or at least in a portion between said finish portion and the most distal liquid electrolyte area.

According to one embodiment, said array of pairs of line sections is defined by the applied adhesive in at least a portion immediately upstream of the finish portion.

According to one embodiment, the method comprises curing said adhesive in at least said finish portion and/or in at least said portion between said finish portion and the most distal liquid electrolyte area before releasing the force of the roller against the second component.

According to one embodiment, the laminating comprises using a roller to successively force increasingly distal portions of the second component against the first component whilst maintaining the part of the second component upstream of the roller under tension; and curing at least a most distal part of the applied adhesive before releasing the force of the roller against the second component.

According to one embodiment, said most distal portion of the applied adhesive is located at the line of contact of the second component with the roller when releasing the force of the roller against the second component, or is located between the most distal liquid electrolyte area and said line of contact of the second component with the roller when releasing the farce of the roller against the second component.

According to one embodiment, said mast distal portion is located immediately upstream of the line of contact of the second component with the roller when releasing the force of the roller against the second component.

According to one embodiment, the first and second components comprises a plurality of at least said working electrodes, said counter electrodes, said containing barriers, said arrays of spacer structures, and said volumes of liquid electrolyte, for forming a plurality of sensing devices; wherein the method comprises successively laminating increasingly distal portions of the second component to the first component in a lamination direction, according to a technique by which said liquid electrolyte material is spread over at least two liquid electrolyte regions contained by respective containing barriers of at least two sensing devices; wherein said two liquid electrolyte regions are arranged in series in said lamination direction; and wherein the method comprises providing said spacer structures additionally in at least an intermediate region between said two liquid electrolyte regions in the lamination direction.

According to one embodiment, said spacer structures are additionally provided in at least a portion of said intermediate region directly adjacent to proximal one of said two liquid electrolyte regions in the lamination direction.

According to one embodiment, said spacer structures are provided substantially evenly over at least a proximal half of said intermediate region in the lamination direction.

According to one embodiment, said spacer structures are provided evenly over at least a distal half of said intermediate region in the lamination direction.

According to one embodiment, adhesive is provided on at least one of said first and second components such that said adhesive is located over part but not all of said intermediate region, and said spacer structures are additionally provided in a part of said intermediate region in which said adhesive is not located.

According to one embodiment, at least one of said first and second components comprises at least one reference electrode supported on the respective support film.

Embodiments of the present application are described in detail hereunder, by way of example, only with reference to the accompanying drawings, in which.

According to one example embodiment of a technique according to the present invention, a process of producing a sensing device comprises the steps described below. Unless otherwise stated, the steps may be carried out in a different order to how they are presented below. The example described in detail below is for the case of producing a single sensing device from a lamination of two components, but as mentioned further below, the same technique may be used to produce a plurality of sensing devices from a lamination of two components.

Figure 3:
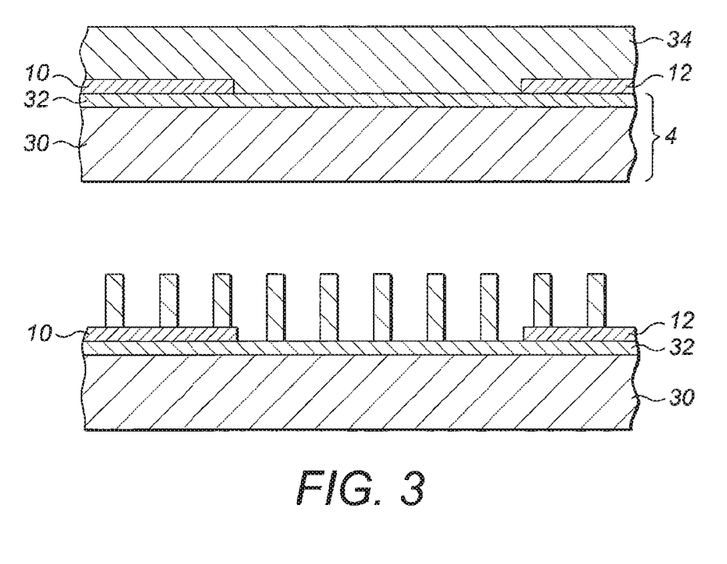
FIG. 3 illustrates an example of a technique for producing the other of the two components of FIG. 1.

A. With particular reference to FIG. 3, a planarised, flexible plastic base film 22 (temporarily and reversibly supported on a more rigid carrier (not shown) having a thickness of e.g. about 50 microns is coated with a layer of electrolyte barrier material 24 (such as a fluoropolymer) in at least the area where the liquid electrolyte is to be contained. This hydrophobic layer 24 functions to protect the plastic base film 22 from chemical attack by the liquid electrolyte.

B. The resulting coated base film 2 is then patterned by e.g. laser ablation or mechanical punching to form through holes 26 extending completely through the plastic base film 22 and the hydrophobic layer 24 in a region where a sensing (working) electrode 6 is to be located.

C. A porous, sensing electrode 6 is formed, by e.g. screen printing of a paste of electrode material, on the hydrophobic layer 24 in the region where through holes 26 are formed. The sensing electrode 6 is sufficiently porous to allow diffusion of the target gas from the through holes 26 in the hydrophobic layer/plastic base film to reaction points where sensing electrode material is in intimate contact with the liquid electrolyte 20 (discussed below), but the sensing electrode 6 also prevents the liquid electrolyte from exiting the cell via the through holes 26. The porous, sensing electrode may comprise a support material having a porous structure that supports within its pores particles of a catalyst material that promotes the electrochemical reaction between the target species and the liquid electrolyte 20. The sensing electrode 6 includes a portion 8 outside the area in which the liquid electrolyte is to be contained, for forming an electrical connection via a corresponding contact 14 on the second component B to a read-out electronics chip 28 supported on the support film 30 of the second component B.

Figure 2:
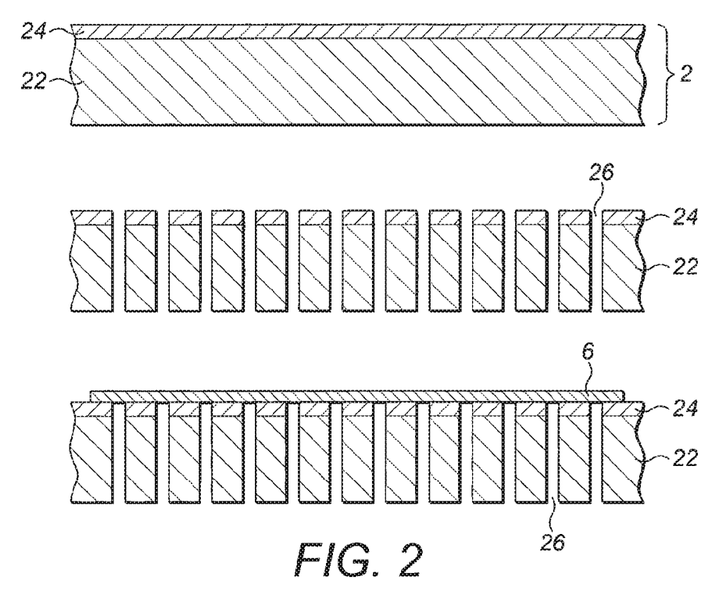
FIG. 2 illustrates an example of a technique for producing one of the two components of FIG. 1.

D. With particular reference to FIG. 2, the production of a second component B begins by coating a flexible, plastic support film 30 with a layer of electrolyte barrier material 24 (such as a fluoropolymer) in at least the area where the liquid electrolyte is to be contained, and then forming patterned reference and counter electrodes 10, 12 and associated routing circuitry 10a, 12a by forming a blanket layer of e.g. metal by e.g. a vapour deposition technique, and then patterning the blanket layer by e.g. photolithography. Depending on the nature of the target gas and the electrochemical reaction of the target gas at the sensing electrode, the counter electrode may be made of a different material that is more suited (than the material of the sensing electrode 6) to the counter electrochemical reaction that balances the electrochemical reaction at the sensing electrode 6. Each of the reference and counter electrodes 10, 12 is provided with respective routing 10a, 12a to respective contacts outside a region in which the liquid electrolyte is contained, which contacts are for connection to the respective inputs of e.g. a chip 28 comprising read-out electronics. The conductor (e.g. metal) layer that defines the reference and counter electrodes 10, 12, also defines (i) a contact 14 that becomes electrically connected to the contact 8 on the first component when the two components A, B are laminated together, and (ii) routing from this contact 14 to a contact for connection to the respective input of said chip 28 comprising read-out electronics.

E. Over the patterned reference and counter electrodes 10, 12 and over the exposed areas of the electrolyte barrier layer 32 in at least the area where the liquid electrolyte is to be contained, is deposited a layer 34 of spacer structure material or a precursor to a spacer structure material. This layer 34 is then patterned by photolithography to define in the layer of spacer an array of spacer structures 16, which function in the completed device to secure a space for the liquid electrolyte material between the sensing electrode 6 and the reference/counter electrodes 10, 12. The spacer structures serve to maintain a substantially uniform spacing between the sensing electrode and the reference/counter electrodes over substantially the entire area to be occupied by the liquid electrolyte. The spacer structure material used to form the spacer structures may be any material that is resistant to chemical attack by the liquid electrolyte. A fluoropolymer material may be suitable for many types of liquid electrolyte. The smallest separation distance between the reference and counter electrodes 10, 12 is made to be significantly larger than the thickness of the layer of spacer structure material, so that the smallest separation distance between the reference and counter electrodes is larger than the thickness of electrolyte between the working and counter electrodes in the completed device. The spacer structures 16 may take the form of columns or other structures. The pattern/form of the spacer structures 16 may vary between areas in which the spacer structures 16 are formed.

Figure 1:
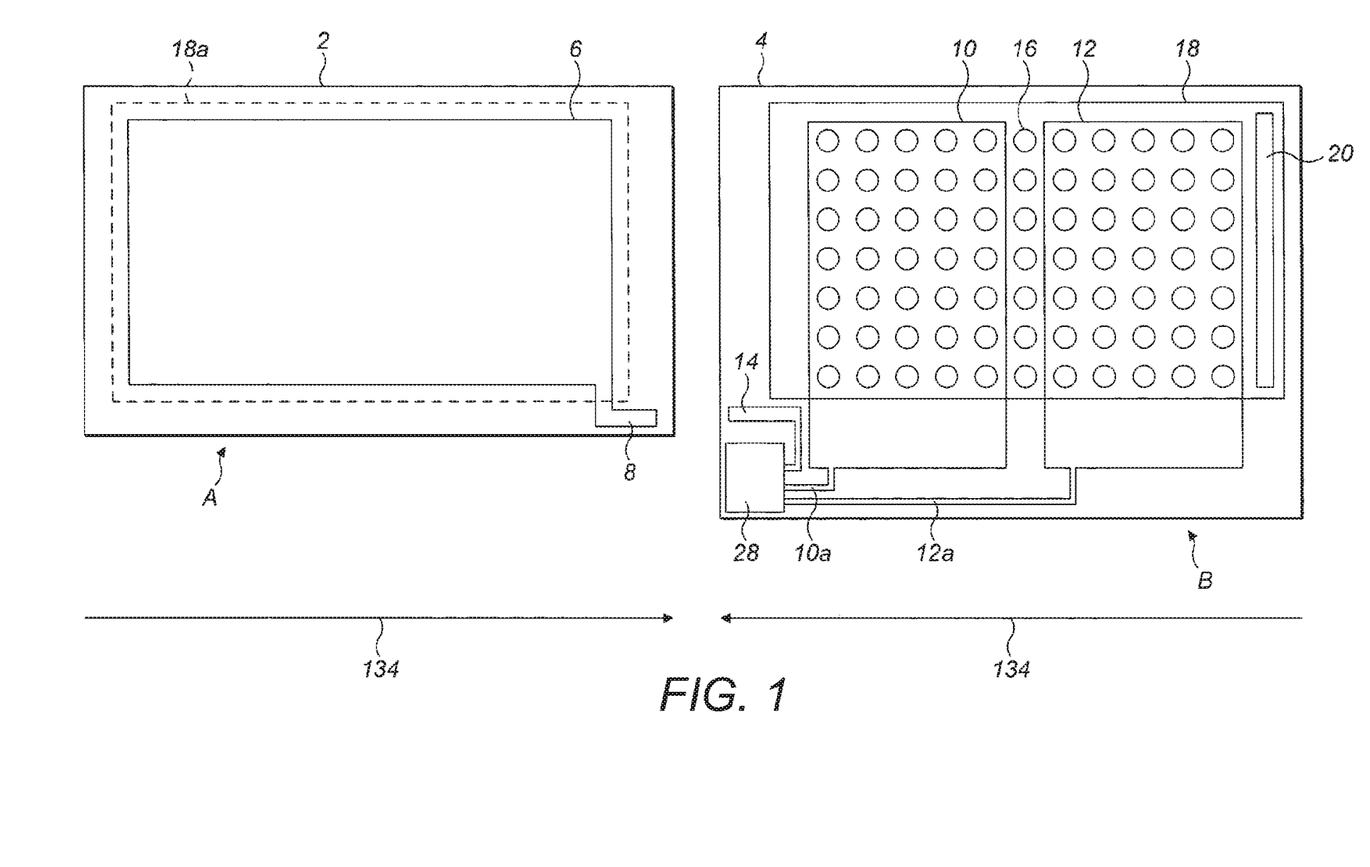
FIG. 1 is a schematic plan view of two components for lamination together to form a sensing device according to an example embodiment of a technique according to the present invention.

F. Adhesive 18 is deposited, by e.g. syringe dispense, around the perimeter of the area in which the spacer structures 16 are located, and a volume of electrolyte material 21 is deposited as e.g. a line of electrolyte material 20 at a proximal* portion of the area bordered by the adhesive 18 and to be occupied by the electrolyte in the final product (*proximal in the direction at which the upper film is laminated to the lower film, as discussed below). The adhesive 18 is shown as a simple, straight line in FIG. 1, but as for example discussed below, the adhesive may be dispensed according to more complex patterns. The volume of liquid electrolyte is selected such that there is sufficient liquid electrolyte to wholly fill the spaces between the spacer structures 16 across the whole area bordered by the line of adhesive 18, when the first and second components A, B are laminated together. The line of electrolyte material extends in a direction substantially perpendicular to the direction of lamination 134 at which the first component A is laminated to the second component B. Line 18*a* in FIG. 1 shows the location of the line of adhesive on the first component A when the first component A is laminated to the second component B.

G. First component A is then gradually laminated to second component B, by e.g. rolling longitudinally-successive width sections of the first component A onto longitudinally-successive width sections of the second component B. The compressive force acting to press together the first and second components functions to spread the volume of electrolyte material 21 (originally deposited as a line 20 on the second component) in the direction of lamination 134. The line of adhesive 18 contains the spread of the electrolyte material between the first and second components A, B.

Figure 4:
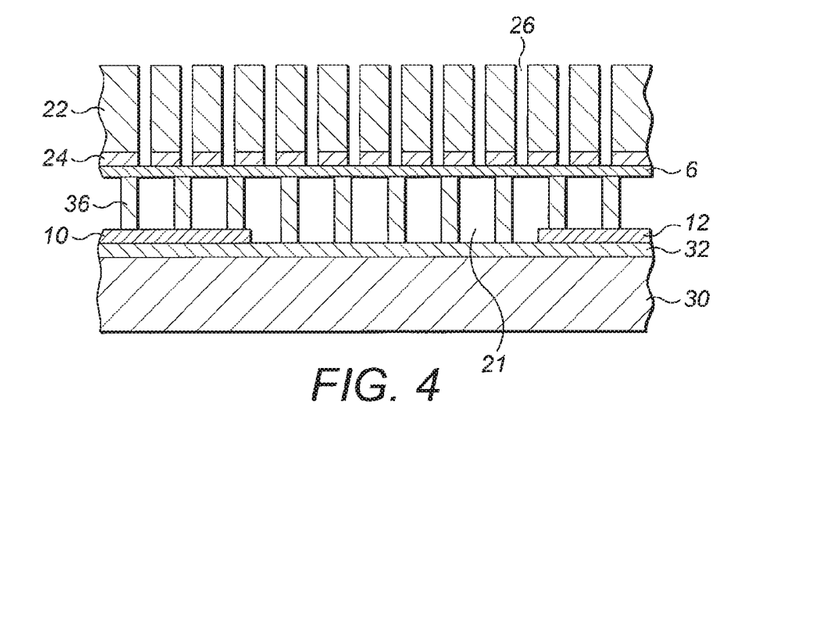
FIG. 4 illustrates the lamination of the two components of FIG. 1 together to form a sensing device according to an example embodiment of a technique according to the present invention.

The lamination process involves using a roller 128 to successively force increasingly distal portions of component A comprising the sensing electrode 6 against the second component B comprising the counter/reference electrodes 10/12, whilst a proximal end of component A is secured to a fixed point 136 to hold the portion of the component A upstream of the roller (i.e. the portion of component A between the roller 128 and the fixed point 136) in tension. The lamination process continues until the roller 128 is located over (or beyond) the most distal portion 120 of the adhesive.

Figure 5:
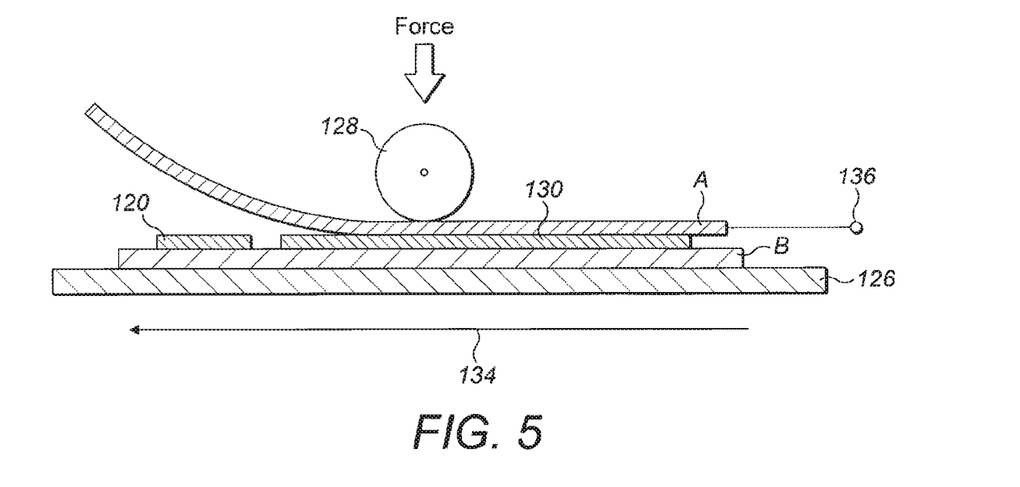
FIGS. 5 and 6 illustrate an example of a lamination technique for use in an example embodiment of the present invention.
Figure 6:
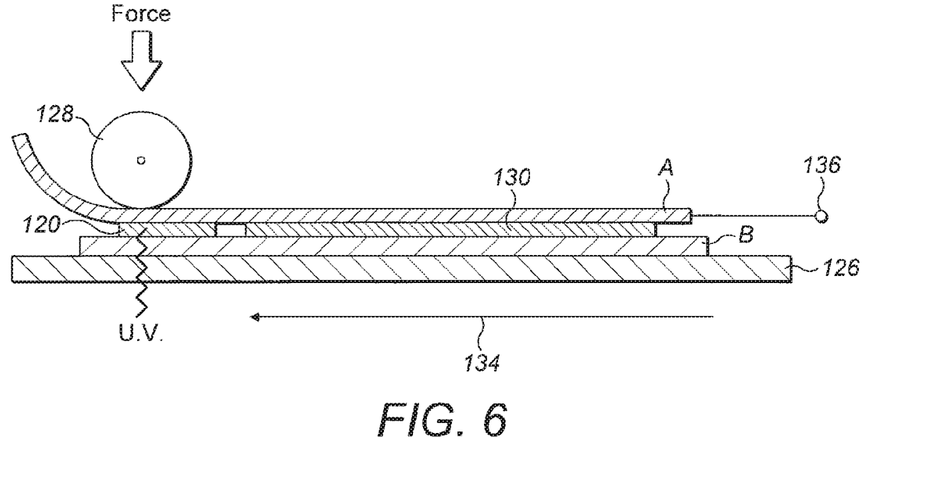
Figure 7:
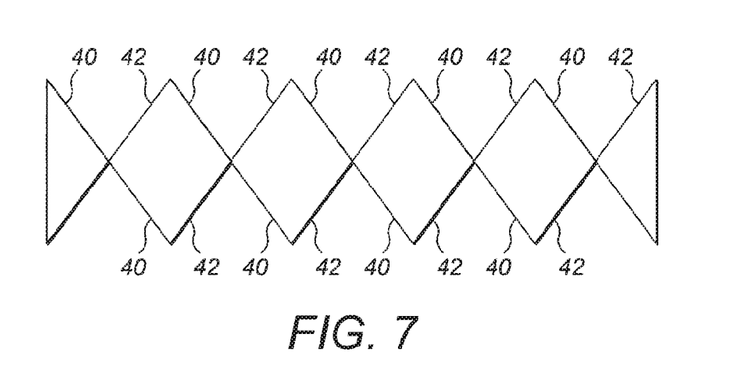
FIGS. 7 and 8 illustrate examples of adhesive patterns for use in an example embodiment of the present invention.
Figure 8:
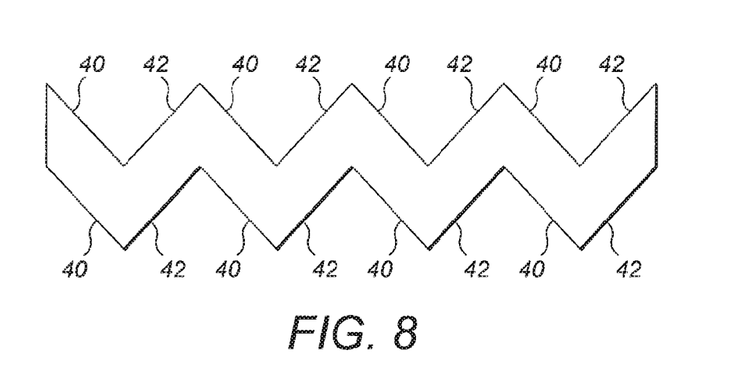

As mentioned above, the lamination process continues until the roller 128 is located over (or beyond) the most distal portion 120 of the adhesive. The adhesive dispensed in this area 120 comprises a continuous line that defines an array of pairs of line sections (40, 42), each pair converging to a meeting point in a direction opposite to the lamination direction. Two examples are shown in FIGS. 7 and 8. In the example of FIG. 7, the continuous line of adhesive comprises two intersecting zig-zag lines each extending in a direction substantially perpendicular to the lamination direction. In the example of FIG. 8, the continuous line of adhesive comprises two parallel, non-intersecting zig-zag lines each extending in a direction substantially perpendicular to the lamination direction. As shown in FIGS. 5 and 6, these zig-zag adhesive patterns are formed selectively in an area 120 where the lamination finishes and/or immediately upstream of where the lamination finishes; they are not formed anywhere else between components A and B. The area 120 over which the zig-zag patterns are formed extends across the whole width of component A. The zigzag patterns provide a continuous and unbroken set of diagonal line sections extending (in area 120) across substantially the whole width of component A, without any spaces or lateral line sections between the diagonal line sections. The lateral width refers to the width in a direction perpendicular to the lamination direction. Each diagonal line section 40, 42 leads directly into another diagonal line section 40, 42, without any intervening space or lateral line section extending in a direction perpendicular to the lamination direction.

When the roller 128 reaches this most distal portion 120 of the adhesive, the adhesive in at least this most distal portion 120 is cured by ultra-violet (UV) irradiation before the force of the roller 128 against the first component A is released. It may be preferable to cure adhesive in all regions simultaneously at this time, i.e. also cure the adhesive in more proximal regions in addition to the adhesive in the most distal region 120, FIG. 6 shows the example of irradiation from below the second component B, but the adhesive may alternatively or additionally be exposed to UV from above the first component A.

The inventors for the present application have identified a problem of crinkling appearing in the laminated portion of the upper component A after releasing the force of the roller 128 against the upper component A; and have found that such crinkling can be better prevented by the techniques described above. Without wishing to be bound by theory, it is thought that adhesive patterns of the kind shown in FIGS. 7 and 8 are effective because they act to better prevent crinkling in the excess portion of the upper component A downstream of the roller 128 (which excess portion is never under tension) propagating beyond the distal adhesive portion 120 when releasing the force of the roller 128 against the upper component A.

The inventors for the present application have found that these techniques are particularly effective for reducing crinkling when using plastic support films having a thickness of about 40 microns and less for component A; crinkling can be less of a problem when using plastic support films having a thickness of about 60 microns and greater. Reducing the thickness of the two components A, B can be beneficial for producing a flexible device; thinner films are found to generally generate less stress within the laminated composite upon bending the composite.

As shown in FIG. 1, first component A has a smaller width (dimension in a direction perpendicular to the rolling lamination direction 134), such that the contacts for connection to respective inputs of a read-out electronics chip 28 remain exposed after lamination of the first component A to the second component B.

H. After lamination is complete, the adhesive is cured, and at least the second component B is trimmed into its final dimensions, before demounting the assembled device from the rigid carrier 126 that supports the second component B during the production process.

In operation, the rate of electrochemical reaction at the sensing electrode (which is dependent on the concentration of the target species to which the sensing electrode is exposed) may, for example, be measured by control circuitry that controls the current through the electrochemical cell so as to maintain the sensing and reference electrodes at a similar potential. The reference electrode is shielded from electrochemical reactions involving the target gas, and may be considered to be at approximately the same potential as the electrolyte. The level of current through the chemical cell required to maintain the sensing and reference electrodes at the same potential is an indicator of the potential difference between the sensing electrode and electrolyte caused by electrochemical reactions at the sensing electrode, and is thus an indicator of the concentration of target gas at the sensing electrode.

For the example of a carbo monoxide sensor: carbon monoxide undergoes an electrochemical reaction with water in the liquid electrolyte at the sensing electrode comprising e.g. a platinum catalyst for the electrochemical reaction, which electrochemical reaction generates carbon dioxide and hydrogen ions. The hydrogen ions are transported by the liquid electrolyte to the counter electrode, where they undergo electrochemical reaction with oxygen dissolved in the liquid electrolyte to form water.

A production method according to an embodiment of the present invention has been described above for the example of a three-electrode design, but the same kind of production method is also applicable to other electrochemical cell designs, such as those including only a sensing electrode and a counter electrode (without a reference electrode), in which the current generated within the electrochemical cell by electrochemical reactions at the sensing electrode (and counter reactions at the counter electrode) is taken as an indicator of the concentration of target gas at the sensing electrode.

In the example, described above, the volume of liquid electrolyte 21 is deposited as a line, and the lamination is carried out by rolling the first component A over the second component from the end of the second component B where the line 20 of liquid electrolyte is located. According to an alternative lamination technique, the liquid electrolyte 21 is dispensed out more widely over the whole of the area bordered by the line of adhesive 18, and the whole of the first component A is then lowered onto the second component B substantially simultaneously, and pressed in a single action down against the second component B, by which action the liquid electrolyte is spread uniformly throughout the space created by the spacer structures within the area contained by the lines of adhesive 18.

In the example described above, a chip 28 is used to provide the read-out electronics. According to one variation, the read-out electronics are defined by a stack of patterned layers deposited over the plastic support film 30, including one or more conductor layers, one or more semiconductor layers, and one or more dielectric/insulation, isolation layers.

In the example embodiment described above, a single sensing device is produced by the lamination of two components. However, more than one sensing device may be produced as the result of the lamination of two components by forming all the elements for a plurality of sensing devices on the support films 22, 30 of the first and second components A, B. For example, sets of the above-described elements for a single sensing device may be formed on multiple locations of relatively long sheets of plastic support films 22, 30, such that a single lamination of the processed, long sheets of plastic support films results in the production of a plurality of sensing devices, which plurality of sensing devices can be separated from each other by cutting after the lamination process. In one example, extra spacer structures are formed in areas between sensing areas (liquid electrolyte areas contained by respective adhesive barriers 18) of successive sensing devices in the direction of lamination. The inventors for the present application have found that including spacer structures in an intermediate region between sensing areas helps to prevent adhesive contaminating the sensing areas and/or excessive amounts of liquid electrolyte developing in parts of the sensing devices. Without wishing to be bound by theory, it is thought that these additional spacer structures in the intermediate region(s) are effective because they reduce the risk of any excess liquid electrolyte material from one sensing area spreading into, and carrying adhesive material into, the next sensing area (in the direction of lamination), by providing a well of relatively large volume for excess liquid electrolyte material in between two sensing areas. As mentioned above, the spacer structures 16 may have a different pattern/form in different areas. For example, the spacer structures 16 may have one pattern/form in the sensing areas and another, different pattern/form in areas between sensing areas. For example, the pattern/form of the spacer structures 16 in the regions between sensing areas may be better (than the pattern/form of the spacer structures 16 in the sensing areas) at providing a well of relatively large volume for excess liquid material in between two sensing areas.

In the example embodiment described above, each completed single sensing device comprises a single sensing cell comprising working, counter and reference electrodes and an electrolyte in contact with the three electrodes. However, a single sensing device may comprise a plurality of sensing cells each comprising (I) a respective set of working, counter and reference electrodes commonly supported by the same upper and/or lower support films and (ii) a respective volume of liquid electrolyte contained between the same upper and lower support films and in contact with the respective set of working, counter and reference electrodes. For example, the plurality of sensing devices may comprise an array of sensing cells for detecting the same target species at different areas of the sensing device, whereby the output of the sensing device can indicate the relative concentrations of the target species at different areas of the sensing device, thereby providing a route to high spatial resolution of the origin of the target species. According to another example, the plurality of sensing cells may comprise a set of sensing cells for detecting different target species; each sensing cell would comprise a respective set of working, counter and reference electrodes and a respective type of liquid electrolyte, all suited to the detection of the respective target species. Each of the plurality of sensing cells may have a respective, parallel set of read-out electronics, or multiple sensing cells can be multiplexed with a single set of readout electronics.

Sensing devices produced according to the above-described techniques may be used, for example, as wearable smart card-type sensors, for e.g. industrial safety applications such as providing a wearer with notification of excessive levels of one or more harmful gases.

The invention claimed is:

1. A method of producing a plurality of devices for sensing a target species, the method comprising:
   providing first and second components, each comprising a support film, wherein at least one of said first and second components comprises a plurality of working electrodes supported on the respective support film, at least one of said first and second components comprises a plurality of counter electrodes supported on the respective support film, at least one of said first and second components defines a plurality of containing barriers supported on the respective support film, and at least one of said first and second components comprises a plurality of arrays of spacer structures supported on the respective support film;
   depositing a plurality of volumes of liquid electrolyte on said first component; and
   successively laminating increasingly distal portions of the second component to the first component in a lamination direction, according to a technique by which said liquid electrolyte is spread out in a space created by said array of spacer structures over at least two liquid electrolyte regions contained by respective containing barriers of at least two sensing devices,
   wherein said two liquid electrolyte regions are arranged in series in said lamination direction;
   wherein the method further comprises providing said spacer structures additionally in at least an intermediate region between said two liquid electrolyte regions in the lamination direction; and
   wherein said liquid electrolyte functions to transport at least one electrochemical reaction product of an electrochemical reaction of the target species at the working electrode to the counter electrode for a counter electrochemical reaction at the counter electrode.

2. The method according to claim 1,
   wherein the containing barrier at least partly comprises one or more lines of adhesive for securing the first and second components together; and
   the method further comprises curing the one or more adhesive lines after laminating said first and second components together.

3. The method according to claim 1, comprising additionally providing said spacer structures in at least a portion of said intermediate region directly adjacent to a proximal one of said two liquid electrolyte regions in the lamination direction.

4. The method according to claim 1, comprising additionally providing said spacer structures substantially evenly over at least a proximal half of said intermediate region in the lamination direction.

5. The method according to claim 1, comprising additionally providing said spacer structures evenly over at least a distal half of said intermediate region in the lamination direction.

6. The method according to claim 1, further comprising providing adhesive on at least one of said first and second components such that said adhesive is located over part but not all of said intermediate region, and wherein said spacer structures are additionally provided in a part of said intermediate region in which said adhesive is not located.

7. The method according to claim 1, wherein at least one of said first and second components comprises at least one reference electrode supported on the respective support film.

8. A method of producing a device for sensing a target species, the method comprising:
   providing first and second components, each comprising a support film, wherein at least one of said first and second components comprises at least one working electrode supported on the respective support film, at least one of said first and second components comprises at least one counter electrode supported on the respective support film, at least one of said first and second components defines a containing barrier supported on the respective support film, and at least one of said first and second components comprises an array of spacer structures supported on the respective support film;
   depositing a volume of liquid electrolyte on said first component;
   laminating said second component to said first component so as to spread said volume of liquid electrolyte out in a space created by said array of spacer structures within a liquid electrolyte area bounded by said containing barrier;
   wherein said liquid electrolyte functions to transport at least one electrochemical reaction product of an electrochemical reaction of the target species at the working electrode to the counter electrode for a counter electrochemical reaction at the counter electrode; and
   wherein said array of spacer structures is formed by a method comprising forming a patternable layer of spacer structure material, or precursor thereto, on the respective support film, and patterning said patternable layer in situ on the respective support film.

9. The method according to claim 8, comprising depositing a line of said liquid electrolyte material at a proximal end of said first component, and successively laminating increasingly distal portions of said second component to said first component in a lamination direction.

10. A method of producing a device for sensing a target species, the method comprising:
    providing first and second components, each comprising a support film, wherein at least one of said first and second components comprises at least one working electrode supported on the respective support film, at least one of said first and second components comprises at least one counter electrode supported on the respective support film, at least one of said first and second components defines a containing barrier supported on the respective support film, and at least one of said first and second components comprises an array of spacer structures supported on the respective support film;
    applying adhesive to at least one of the first and second components before lamination;
    depositing a line of liquid electrolyte material at a proximal end of said first component successively laminating increasingly distal portions of said second component to said first component in a lamination direction so as to spread said volume of liquid electrolyte out in a space created by said array of spacer structures within a liquid electrolyte area bounded by said containing barrier;
    wherein at least a part of said adhesive applied to said first and/or second components defines an array of pairs of line sections of adhesive, each pair of line sections converging to a respective meeting point in a direction opposite to said lamination direction; and wherein said liquid electrolyte functions to transport at least one electrochemical reaction product of an electrochemical reaction of the target species at the working electrode to the counter electrode for a counter electrochemical reaction at the counter electrode.

11. The method according to claim 10, wherein said pairs of line sections are joined to each other at distal ends of said pairs.

12. The method according to claim 10, wherein said array of pairs of line sections defines at least one continuous zig-zag line extending in a direction substantially perpendicular to said lamination direction.

13. The method according to claim 10, wherein said array of pairs of line sections is defined by at least a most distal portion of the applied adhesive in the lamination direction; wherein the laminating comprises using a roller to successively force increasingly distal portions of the second component against the first component whilst maintaining the part of the second component upstream of the roller under tension, and curing said most distal portion of the applied adhesive before releasing the force of the roller against the second component.

14. The method according to claim 10, wherein the laminating comprises using a roller to successively force increasingly distal portions of the second component against the first component whilst maintaining the part of the second component upstream of the roller under tension, and releasing the force of the roller against the second component when the roller is in contact with a finish portion of the second component, and wherein said array of pairs of line sections is defined by the applied adhesive in at least said finish portion and/or at least in a portion between said finish portion and the most distal liquid electrolyte area.

15. The method according to claim 14, wherein said array of pairs of line sections is defined by the applied adhesive in at least a portion immediately upstream of the finish portion.

16. The method according to claim 14, comprising curing said adhesive in at least said finish portion and/or in at least said portion between said finish portion and the most distal liquid electrolyte area before releasing the force of the roller against the second component.

17. The method according to claim 10, wherein the laminating comprises using a roller to successively force increasingly distal portions of the second component against the first component whilst maintaining the part of the second component upstream of the roller under tension; and curing at least a most distal part of the applied adhesive before releasing the force of the roller against the second component.

18. The method according to claim 17, wherein said most distal portion of the applied adhesive is located at the line of contact of the second component with the roller when releasing the force of the roller against the second component, or is located between the most distal liquid electrolyte area and said line of contact of the second component with the roller when releasing the force of the roller against the second component; and wherein said most distal portion is located immediately upstream of the line of contact of the second component with the roller when releasing the force of the roller against the second component.

* * * * *